(12) United States Patent
Uemura

(10) Patent No.: US 7,486,132 B2
(45) Date of Patent: Feb. 3, 2009

(54) VARIABLE CAPACITOR CIRCUIT AND INTEGRATED CIRCUIT CONTAINING THE SAME

(75) Inventor: Akira Uemura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 317 days.

(21) Appl. No.: 11/070,259

(22) Filed: Mar. 3, 2005

(65) Prior Publication Data
US 2005/0195053 A1 Sep. 8, 2005

(30) Foreign Application Priority Data
Mar. 3, 2004 (JP) .............. 2004-059097

(51) Int. Cl.
*H03F 1/14* (2006.01)
(52) U.S. Cl. ........................... 330/51; 330/307
(58) Field of Classification Search ............ 330/51
See application file for complete search history.

(56) References Cited

U.S. PATENT DOCUMENTS 6,486,711 B1 * 11/2002 Tsay et al. ................ 327/96
6,731,175 B1 * 5/2004 Chen ......................... 330/311
6,784,742 B2 * 8/2004 Tsunai et al. ............... 330/284

FOREIGN PATENT DOCUMENTS

| JP | H09-27722 A | 1/1997 |
| JP | 2000-138548 A | 5/2000 |
| JP | 2002-185274 A | 6/2002 |
| JP | 2003-17959 A | 1/2003 |

* cited by examiner

*Primary Examiner*—Khanh V Nguyen
(74) *Attorney, Agent, or Firm*—Sughrue Mion, PLLC

(57) ABSTRACT

A variable capacitance circuit includes a MOS capacitor, and an application voltage switching section configured to change an application voltage to the MOS capacitor to change a capacitance of the MOS capacitor. The variable capacitance circuit connects the MOS capacitor to an electronic circuit. Here, the electronic circuit may be a voltage amplification circuit, and the variable capacitance circuit may function as an amplification gain switching circuit configured to switch an amplification gain of the voltage amplification circuit, by changing the capacitance to be connected to the voltage amplification circuit.

25 Claims, 12 Drawing Sheets

IN CASE OF Vc1<0

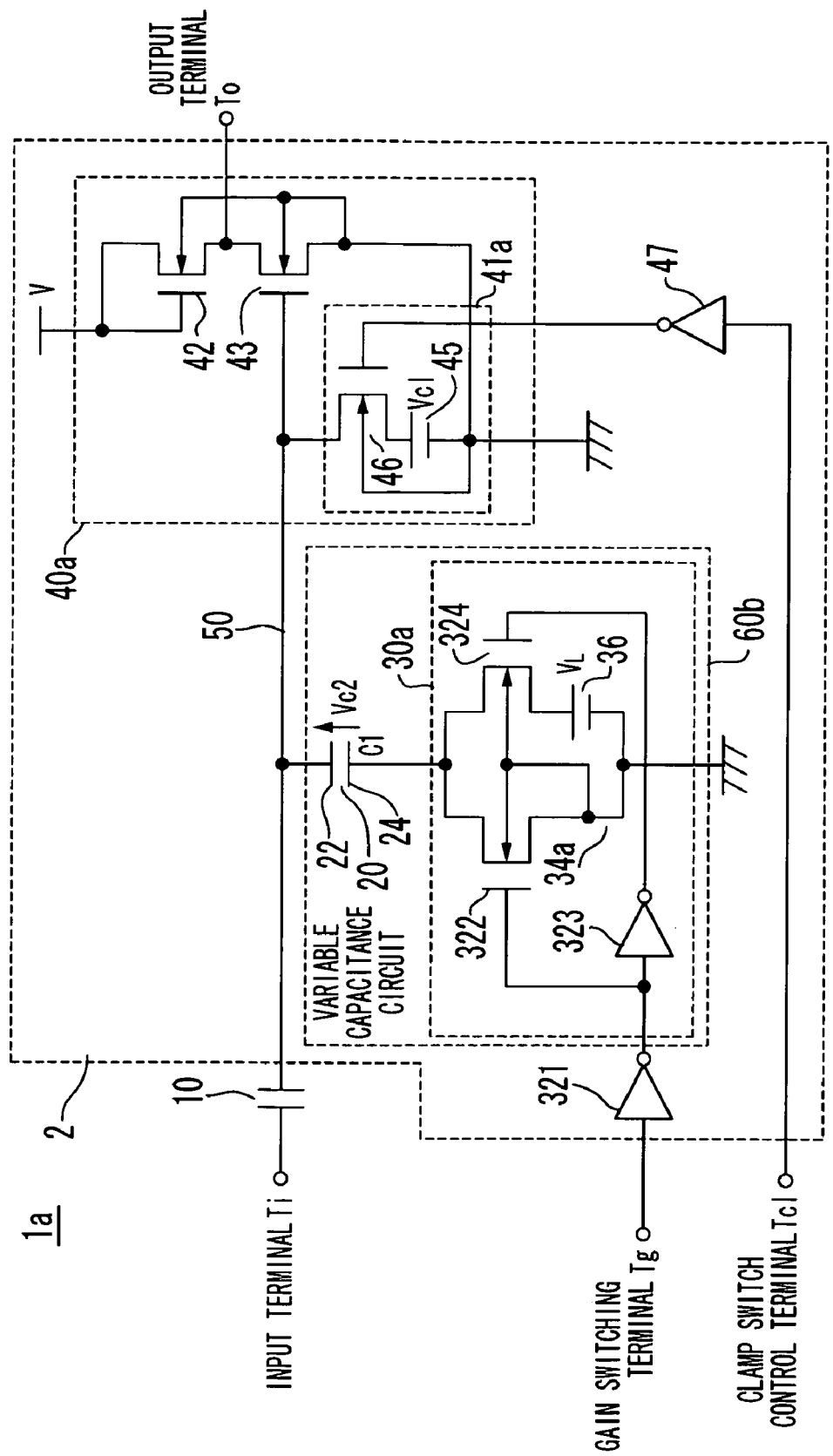

VARIABLE CAPACITOR CIRCUIT AND INTEGRATED CIRCUIT CONTAINING THE SAME

BACKGROUND OF THE INVENTION

1. Field of the Invention

The present invention relates to a variable capacitance circuit and an integrated circuit containing the variable capacitance circuit.

2. Description of the Related Art

A conventional technique of switching the gain of a voltage amplifier circuit by switching an input capacitance is known in Japanese Laid Open Patent Application (JP-P2003-17959A). FIG. 1 shows such a variable gain amplifier.

The variable gain amplifier shown in FIG. 1, is composed of a coupling capacitor 10, a pair of switches 92 and 94, capacitors 91 and 93, and inverters 321 and 323. The coupling capacitor 10 is connected to an input terminal Ti at one terminal. Each of the switches 92 and 94 (N-MOS transistors) has a first contact (source or drain) connected to the other end of the coupling capacitor 10. The capacitors 91 and 93 are respectively inserted between second contacts of the switches 92 and 94 and a ground conductor. The inverters 321 and 323 are connected in series. An amplifier circuit 940 has an input terminal connected to an input node 950 to which first contacts of the switches 92 and 94 are connected. The input terminal of the amplifier circuit 940 is the gate of an N-MOS transistor 943, and the drain of the N-MOS transistor 943 is connected to an output terminal To. A gain switch signal is supplied to an input terminal of the inverter 321. Output terminals of the inverters 321 and 323 are respectively are connected to control terminals (gates) of the switches 92 and 94.

In this conventional circuit, by switching the gain switch signal, one of the capacitors 91 and 93 can be connected to the node 950. In this conventional circuit, an approximate voltage amplification gain β in the path from the input terminal Ti to the output terminal To is represented by the following equation (1):

$$\beta = \alpha * C1 * C1 * (C2 + Cdg + Csg)/(C2 + \alpha * Cdg + Csg) \quad (1)$$

where α represents a gain of the amplifying N-MOS transistor 943, C2 is a capacitance between the node 950 and the ground conductor (in this case, the capacitance of one of the capacitors 91 and 93 which is connected to the node 950); Csg and Cdg represent a source-gate parasitic capacitance of the amplifying N-MOS transistor 943, and the drain-gate parasitic capacitance of the transistor 943, respectively.

Accordingly, as the capacitance C2 between the node 950 and the ground conductor increases, the amplification gain β reduces in an inverse proportional relation. As a result, the gain β of the amplifier circuit can be varied by changing the capacitance C2.

According to the above-described method, however, one capacitor should be provided to each of selectable gain values. Therefore, to realize a large number of gain values, the layout area for the capacitors on an IC chip increases proportionally to the increase in the number of capacitors.

In conjunction with the above description, a gain variable amplification device is disclosed in Japanese Laid Open Patent Application (JP-A-Heisei 9-27722). In this conventional example, a first capacitor for negative feedback and a first switch for the gain switching are connected between an inversion input terminal and a positive side output terminal, a second capacitor is connected between the inversion input terminal and a fixed potential. A differential amplifier applies an input voltage to a non-inversion input terminal, and a second switch for gain switching is connected between the inversion input terminal and an output terminal A third capacitor is connected between the inversion input terminal and the fixed potential. An operational amplifier receives the positive side output of the differential amplifier at the non-inversion input terminal. A fourth capacitor for the negative feedback is connected between the inversion input terminal of the differential amplifier and which and the output terminal of the operational amplifier.

Also, a gain variable inversion amplifier circuit is disclosed in Japanese Laid Open Patent Application (JP-P2000-138548A). This conventional example includes one or more input capacitances to whose input an analog input voltage is connected. An input refreshment switch is connected with the input of the input capacitance and connects the analog input voltage or a reference voltage with the input capacitance. An amplifier is connected with the output of the input capacitance and generates an inversion output. One or more feedback capacitances are connected with the output of the amplifier. An amplifier refreshment switch connects the input and output of the amplifier. An output refreshment switch is connected with the output of the feedback capacitance and connects these outputs with the output of the amplifier or the reference voltage. A part of the input capacitance or feedback capacitance is invalidated to control the gain of the output voltage of the amplifier. One end of each of the input capacitances or feedback capacitances is connected with the amplifier input or the reference voltage by a multiplexer.

Also, a gain switching amplification circuit is disclosed in Japanese Laid Open Patent Application (JP-P2002-185274A). In this conventional example, emitters of first and second transistors are connected with a collector of a third transistor, which has a base connected an input, and an emitter connected with a second resistance and a first capacitor. A first resistance is connected between the input and a second power supply. The second power supply is connected between the first resistance and the ground. The second resistance is connected between the emitter of the third transistor and the ground. A first capacitor is connected between the emitter of the third transistor and the ground. The first transistor has a gate connected with a gain setting input, an emitter connected with the collector of the third transistor and a collector connected with the first power supply. The second transistor has a base connected with a fourth power supply, an emitter connected with the collector of the third transistor and a collector connected with the output. The first power supply is connected with the collector of the first transistor and a first inductor in one end and grounded at the other end. The first inductor is connected between the first power supply and the output. A fourth power supply is connected between the base of the second transistor and the ground. A second capacitor is connected between the input and the base of a fifth transistor. A third resistance is connected with the base of the second capacitor and the fifth transistor at one end and connected with the third power supply at the other end. The third power supply is connected between the third resistance and the ground. The fifth transistor has a base connected with the third resistance and the second capacitor, an emitter connected with the fourth resistance and the third capacitor and a collector connected with the emitter of the fourth transistor. A fourth resistance is connected with the emitter of the fifth transistor and the third capacitor at one end and grounded at the other end. The third capacitor is connected with the emitter of the fifth transistor and the fourth resistance at one end and grounded the other end. The fourth transistor has a base connected with the fourth power supply and the base of the second transistor, an emitter connected with the collector of the fifth transistor and a collector connected with the output.

SUMMARY OF THE INVENTION

In an aspect of the present invention, a variable capacitance circuit may include a MOS capacitor, and an application voltage switching section configured to change an application voltage to the MOS capacitor to change a capacitance of the MOS capacitor. The variable capacitance circuit connects the MOS capacitor to an electronic circuit.

Here, the electronic circuit may be a voltage amplification circuit, and the variable capacitance circuit may function as an amplification gain switching circuit configured to switch an amplification gain of the voltage amplification circuit, by changing the capacitance to be connected to the voltage amplification circuit.

Also, the electronic circuit may receive an input signal through a coupling capacitor connected with a connection conductor, through which the electronic circuit is connected with one end of the variable capacitance circuit. The electronic circuit may include a reference voltage source connected to the connection conductor in parallel to the variable capacitance circuit and configured to apply a predetermined DC voltage to the connection conductor. Also, the application voltage switching section may include a variable voltage source connected with the MOS capacitor in series and configured to output an output voltage in response to a control signal. In this case, it is preferable that the MOS capacitor presents a first capacitance when the application voltage is in a first region lower than a first negative threshold voltage and presents a second capacitance higher than the first capacitance when the application voltage is in a second region higher than a second positive threshold voltage. The control signal may be a binary signal, and the variable voltage source may output one of a first voltage and a second voltage different from the first voltage in response to the control signal. The first voltage may be set such that the application voltage falls within the first region regardless of a change of the input signal, and the second voltage may be set such that the application voltage falls within the second region regardless of the change of the input signal. Also, the first voltage and the second voltage may be sets such that the following relations are met:

(the first voltage)≧(the predetermined DC voltage−
the first threshold voltage+a permission voltage
range of the change of the input signal), and (the second voltage)≦(the predetermined DC voltage+second threshold voltage−a permission voltage of the change of the input signal).

Also, the variable voltage source may include a first voltage source configured to output the first voltage; a second voltage source configured to the second voltage; and a 2-contact switch circuit configured to connects one of the first voltage sources and the second voltage source with the MOS capacitor in response to the control signal.

Also, a switch may be inserted between the connection conductor and the variable capacitance circuit and configured to open and close in response to a second binary control signal.

In another aspect of the present invention, an integrated circuit includes an electronic circuit configured to process a signal supplied from a signal input terminal; and a variable capacitance circuit configured to be able to switch a capacitance connected to the electronic circuit. The variable capacitance circuit includes a MOS capacitor to be connected with the electronic circuit; and an application voltage switching section configured to change an application voltage to the MOS capacitor to change a capacitance of the MOS capacitor.

Here, the electronic circuit may be a voltage amplification circuit, and the variable capacitance circuit may include an amplification gain switching circuit configured to switch an amplification gain of the voltage amplification circuit, by changing the capacitance to be connected to the voltage amplification circuit.

Also, the electronic circuit may receive an input signal through a coupling capacitor connected with a connection conductor, through which the electronic circuit is connected with one end of the variable capacitance circuit. The electronic circuit may include a reference voltage source connected to the connection conductor in parallel to the variable capacitance circuit and configured to apply a predetermined DC voltage to the connection conductor. The application voltage switching section may include a variable voltage source connected with the MOS capacitor in series and configured to output an output voltage in response to a control signal.

Also, the variable voltage source outputs an optional voltage in a predetermined range in response to the control signal.

Also, it is preferable that the MOS capacitor presents a first capacitance when the application voltage is in a first region lower than a first negative threshold voltage and presents a second capacitance higher than the first capacitance when the application voltage is in a second region higher than a second positive threshold voltage. The control signal may be a binary signal, and the variable voltage source may output one of a first voltage and a second voltage different from the first voltage in response to the control signal. Also, the first voltage may be set such that the application voltage falls within the first region regardless of a change of the input signal, and the second voltage may be set such that the application voltage falls within the second region regardless of the change of the input signal. In this case, the first voltage and the second voltage may be sets such that the following relations are met:

(the first voltage)≧(the predetermined DC voltage−
the first threshold voltage+a permission voltage
range of the change of the input signal), and (the second voltage)≦(the predetermined DC voltage+the second threshold voltage−a permission voltage of the change of the input signal).

Also, the variable voltage source may include a first voltage source configured to output the first voltage; a second voltage source configured to the second voltage; and a 2-contact switch circuit configured to connects one of the first voltage sources and the second voltage source with the MOS capacitor in response to the control signal.

Also, the output voltage of the first voltage source may be zero.

Also, the 2-contact switch circuit may include two MOS transistors in which one of drain electrodes and source electrodes is connected to a common terminal, and the other constitutes two contacts; and an inverter circuit connected between gate electrodes of the two MOS transistors.

Also, the variable capacitance circuit may further include a switch inserted between a series circuit of the MOS capacitor and the variable voltage source and the connection conductor and configured to open or close in response to a second binary control signal.

Also, the reference voltage source may be a clamping circuit, and the integrated circuit may include a clamp switch circuit inserted between the connection conductor and the clamping circuit.

Also, the integrated circuit may further include a plurality of the variable capacitance circuits connected in parallel.

Also, the integrated circuit may further include a control unit configured to receive an external command, to decode the command, and to generate the control signal based on the command to control the variable voltage sources of the plurality of variable capacitance circuits.

Also, the application voltage switching section may include a variable voltage source connected in series with the MOS capacitor. The variable voltage source may include a 2-contact switch circuit configured to supply one of a ground potential and a power supply voltage in response to a control signal.

BRIEF DESCRIPTION OF THE DRAWINGS

FIG. 5 is a circuit diagram showing an integrated circuit according to a first embodiment of the present invention;

DESCRIPTION OF THE PREFERRED EMBODIMENTS

Figure 1:
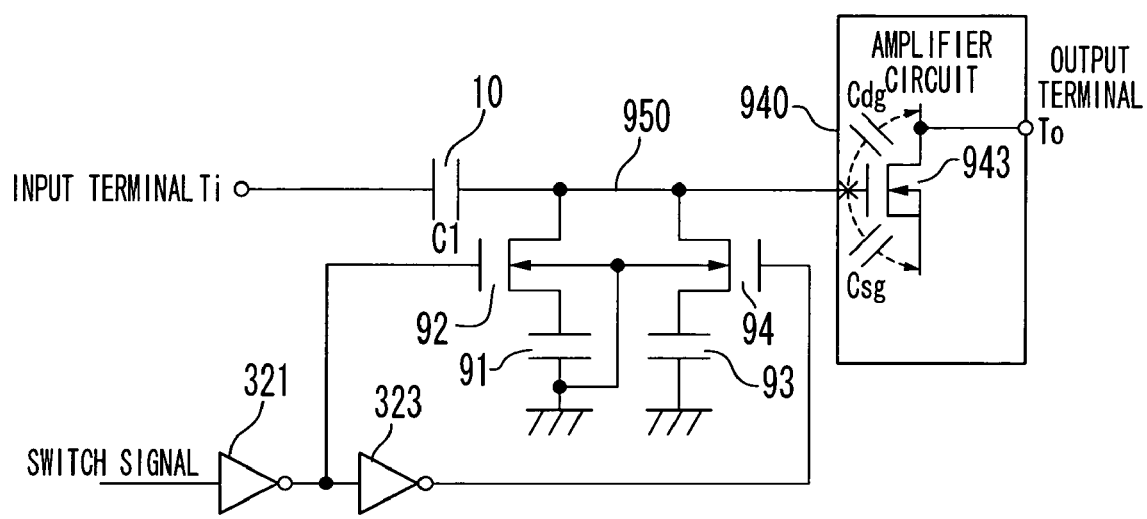
FIG. 1 is a circuit diagram showing a conventional variable capacitance circuit.

Hereinafter, an integrated circuit containing a variable capacitance circuit of the present invention will be described in detail with reference to the attached drawings. In the attached drawings, same components are assigned with same reference numerals and symbols.

[Principle]

First, before describing embodiments, the principle of the present invention will be generally described.

Figure 2A:
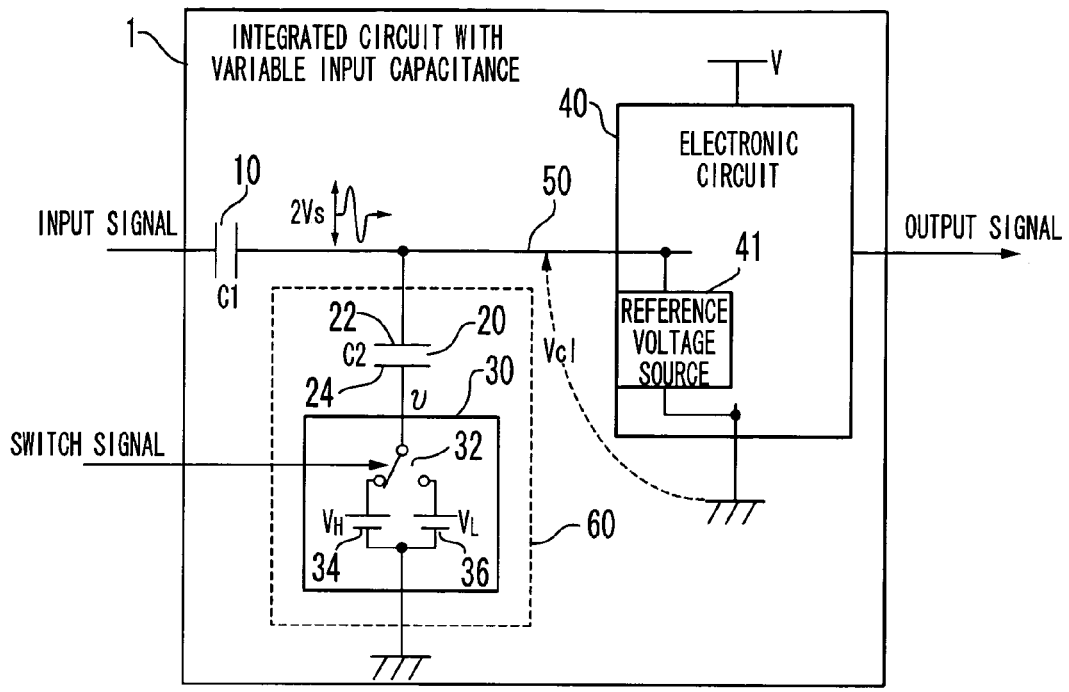
FIG. 2A is a circuit diagram showing the configuration of an integrated circuit 1 containing a variable capacitance circuit 60 according to the present invention.
Figure 2B:
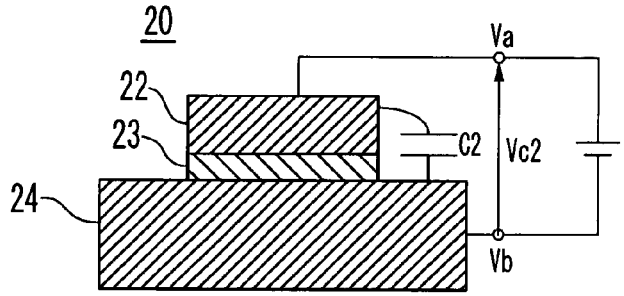
FIG. 2B is a vertical cross sectional view of a thin-film laminate structure of a MOS capacitor.
Figure 2C:
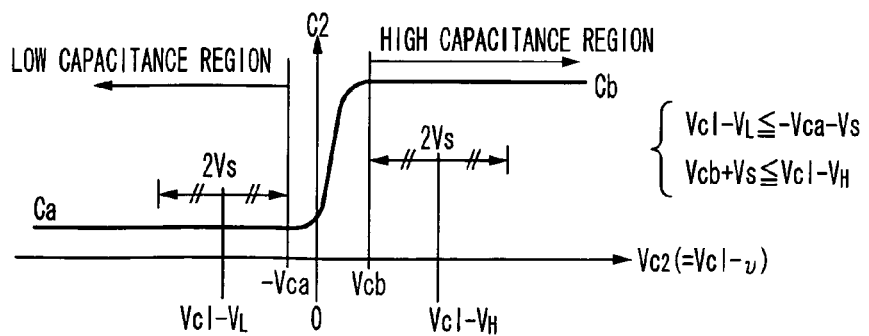
FIG. 2C is a graph showing a voltage-capacitance characteristic of the MOS capacitor shown in FIG. 2B and an operation of the variable capacitance circuit of the present invention.

FIGS. 2A to 2C are diagrams showing the principle of an integrated circuit 1 containing a variable capacitance circuit 60 according to the present invention. With reference to FIG. 2A, the integrated circuit 1 is composed of a coupling capacitor 10, a variable capacitance circuit 60 and an electronic circuit 40. The coupling capacitor 10 has one terminal for receiving an input signal, and the variable capacitance circuit 60 is connected between the other terminal of the coupling capacitor 10 and a ground conductor. The electronic circuit 40 has an input terminal connected to an input node 50 between the coupling capacitor 10 and the variable capacitance circuit 60.

The variable capacitance circuit 60 is composed of a capacitor 20 having terminals 22 and 24 and a 2-stage variable voltage source 30 connected with the capacitor 20 in series. The terminal 22 of the capacitor 20 is connected to the input node 50. The 2-stage variable voltage source 30 is composed of a 2-contact switch 32 and constant voltage sources 34 and 36. The 2-contact switch 32 has a common terminal connected to the terminal 24 of the capacitor 20, and two connection contacts. The constant voltage sources 34 and 36 have anodes respectively connected to the two connection contacts of the 2-contact switch 32, and cathodes which are grounded. The constant voltage sources 34 and 36 supply two different voltages VH and VL to the capacitor 20, respectively. Therefore, only one of the constant voltage sources 34 and 36 is selected and connected to the terminal 24 of the capacitor 20 in response to a switching signal supplied to the 2-contact switch 32.

Figure 3A:
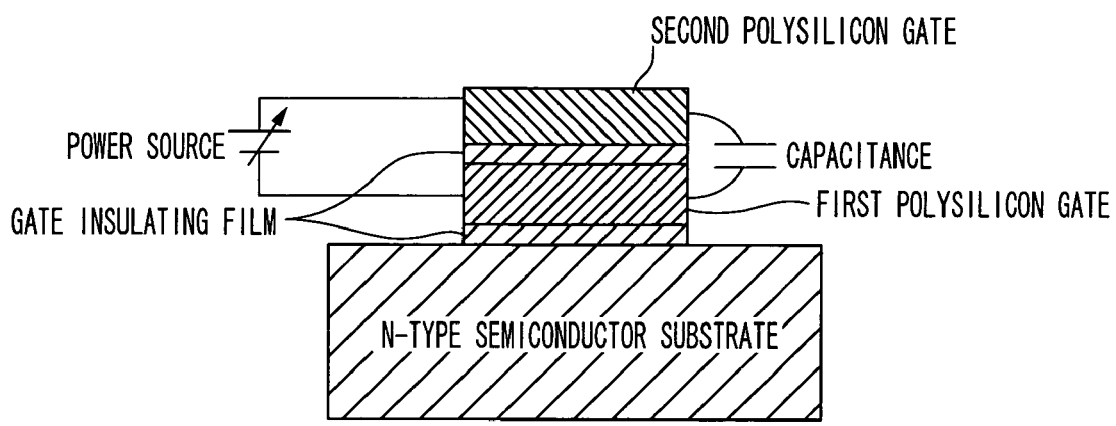
FIG. 3A is a cross sectional view showing the structure of a polysilicon gate type capacitor.
Figure 3B:
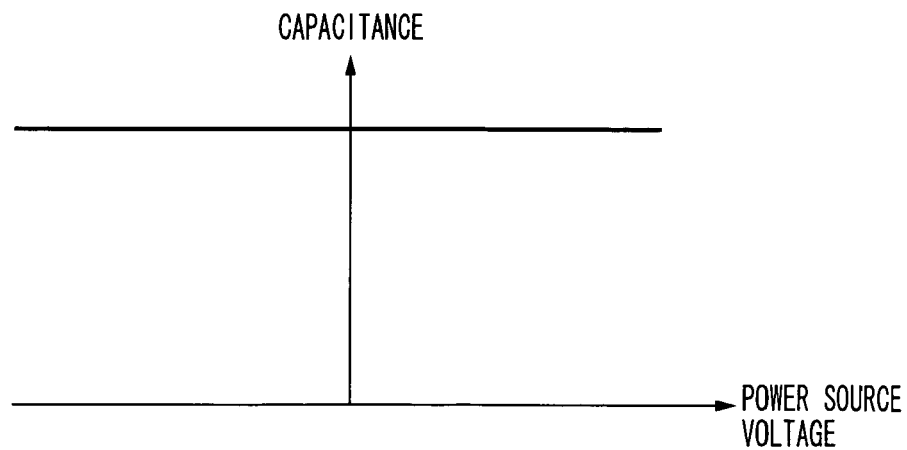
FIG. 3B is a graph showing the voltage-capacitance characteristic of the polysilicon gate type capacitor shown in FIG. 3A.

The capacitor 20 is a surface-mounting type of capacitor and is provided on the integrated circuit 1. Generally, one of the following two types is used for the surface-mounting type of capacitor. The one type of capacitor is a capacitor of a polysilicon gate type that has a structure shown in FIG. 3A. This type of capacitor has a constant capacitance irrespective of an applied voltage, while the capacitance per unit area is relatively small as shown in FIG. 3B. The other type of capacitor is a MOS capacitor that has a structure shown in FIG. 2B. This type of capacitor is a MOS capacitor having a relatively large capacitance per unit area, and the capacitance significantly varies in the neighborhood of an applied voltage of about 0 volt (V) as shown in FIG. 2C. In the present invention, the MOS capacitor is used as the capacitor 20. The electronic circuit 40 has a reference voltage source 41 between the ground conductor and the input node 50, to apply a constant voltage Vc1 to the input node 50 to the ground conductor as shown in FIG. 2A by a broken arrow.

FIG. 2B is a vertical cross sectional view showing the surface-mounting type MOS capacitor 20 on the integrated circuit 1. FIG. 2C is a view showing a voltage-capacitance characteristic of the capacitor 20 and an operational principle of the variable capacitance circuit 60 according to the present invention.

With reference to FIG. 2B, the MOS capacitor 20 is composed of an N-type semiconductor substrate 24, a gate oxide film 23 formed as an insulating film on the substrate 24, and a polysilicon gate electrode 22 formed on the gate oxide film 23. In this configuration, an electrostatic capacitance C2 is provided between the semiconductor substrate 24 and the polysilicon gate electrode 22. When a positive voltage Vc2 is applied to the polysilicon gate electrode with respect to the substrate 24, the MOS capacitor 20 varies as shown in FIG. 2C by a Vc2–C2 curve as the voltage Vc2 varies.

Referring again to FIG. 2C, the capacitance C2 of the MOS capacitor 20 is stable at a low capacitance Ca, when the voltage Vc2 of the MOS capacitor 20 in the arrow direction is lower than a voltage −Vca, which is close to the ground potential. The capacitance C2 of the MOS capacitor 20 sharply increases with the change of the voltage Vc2 from −Vca to a positive voltage Vcb. When the voltage Vc2 is Vcb or higher, the capacitance C2 of the MOS capacitor 20 is stable at a capacitance Cb that is significantly larger than Ca. In this case, the region of the voltage Vc2 equal to or lower than −Vca is referred to as a "low capacitance operation region", and the range of the voltage Vc2 equal to or higher than Vcb is referred to as a "high capacitance operation region". Under the above conditions, the operation of the integrated circuit 1 will be described below.

To avoid confusion in interpretation, it is assumed that the voltage Vc1 of the reference voltage source 41 in the broken arrow direction is a positive voltage. In addition, it is assumed that the MOS capacitor 20 is disposed such that the polysilicon gate electrode 22 thereof is connected to the input node 50, and the semiconductor substrate 24 thereof is connected to the 2-stage variable voltage source 30. Under the above assumptions, a voltage VH of the voltage source 34 is set with respect to the ground conductor so that the voltage Vc2 of the MOS capacitor 20 falls within the high capacitance operation region, and a voltage VL of the voltage source 36 is set with respect to the ground conductor so that the capacitance voltage Vc2 falls within the low capacitance operation region. In this case, the capacitance C2 of the MOS capacitor 20 can be set to either one of the low capacitance Ca and the high capacitance Cb by using a switching signal.

As described above, the input node 50 is fixed to the voltage Vc1 by the reference voltage source 41 in the DC operation. However, an AC component of the input signal is applied to the input node 50 through the coupling capacitor 10. Therefore, when an upper limit of the amplitude of the AC component to be applied to the input node 50 is Vs, the voltage of the input node 50 possibly changes within a range of VC1±Vs. In general use, even when the voltage Vc2 across the MOS capacitor 20 changes in association with the change of the voltage of the input node 50, the voltage Vc2 is preferably falls within either one of the low capacitance operation region and the high capacitance operation region, so that the capacitance C2 of the MOS capacitor 20 does not change and remains at Ca or Cb. When a voltage of the 2-stage variable voltage source 30 applied to the MOS capacitor 20 is represented by v with respect to the ground conductor, Vc2=Vc1−v. In this case, in the low capacitance operation region, v=VL; and in the high capacitance operation region, v=VH. In order that the voltage Vc2 applied to the MOS capacitor 20 falls within the low capacitance operation region even when the voltage of the input signal changes to +Vs, it is necessary to meet Vc2(=Vc1−VL)≦−Vca−Vs. Similarly, in order that the voltage Vc2 applied to the MOS capacitor 20 falls within the high capacitance operation region even when the voltage of the input signal changes to −Vs, it is necessary to meet Vc2(=Vc1−VH)≧Vcb+Vs. Therefore, the voltages VH and VL of the respective voltage sources 34 and 36 used in the 2-stage variable voltage source 30 should be set to meet the following equations (2) and (3), even if various conditions other than the above are taken into account.

$$VL \geq Vc1 + Vca + Vs \qquad (2)$$

$$VH \leq Vc1 - Vcb - Vs \qquad (3)$$

In the above, for simplifying the description, the potential of the terminal of the variable capacitance circuit 60 on the side opposite to the input node 50 is set to the ground potential. However, the present invention is not limited to this. In other cases, the equations (2) and (3) are applicable, too, by setting the voltage of the variable capacitance circuit 60 in the broken arrow direction to Vc1.

Figure 4A:
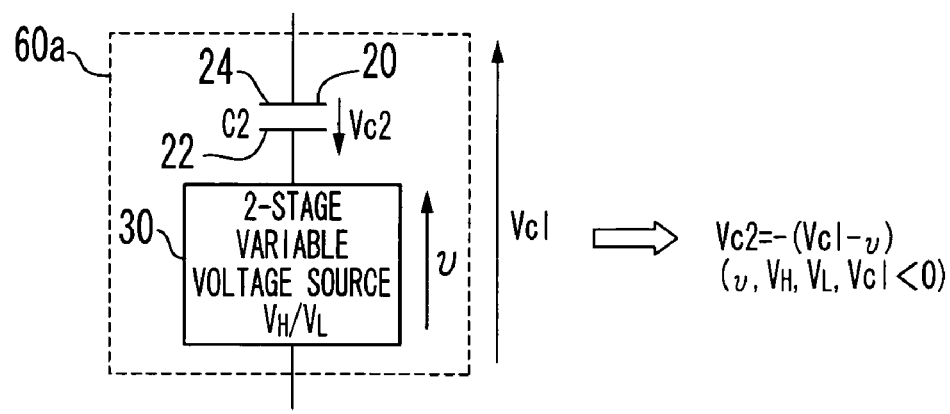
FIG. 4A is a diagram showing the structure of the variable capacitance circuit when a constant voltage (Vc1) is negative.
Figure 4B:
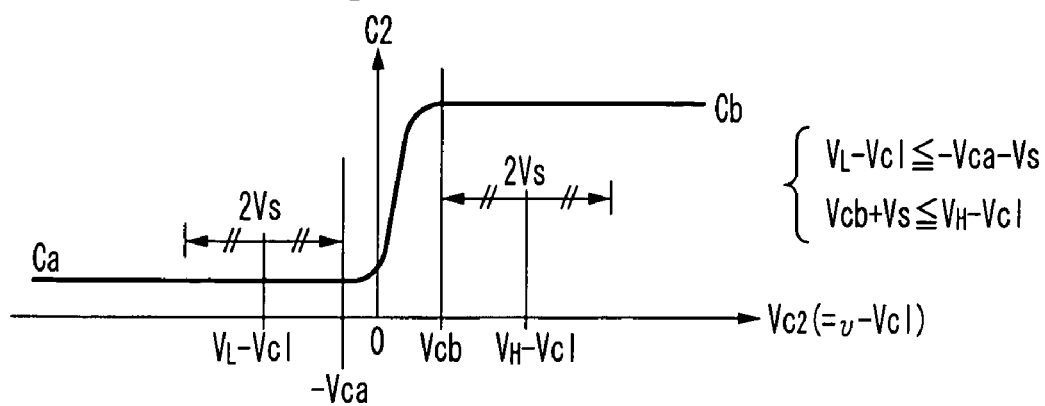
FIG. 4B is a graph showing the operation of the circuit shown in FIG. 4A.

In the above description, although the potential of the input node 50 is assumed to be higher than the potential of the ground conductor, that is, the voltage Vc1 is a positive voltage, the opposite case can possibly take place. FIG. 4A is a diagram showing the structure of a variable capacitance circuit 60a, and FIG. 4B is a diagram showing the operation of the circuit 60a. With reference to FIG. 4A, when Vc1<0, the MOS capacitor 20 of the variable capacitance circuit 60a is mounted in the opposite direction to the case of Vc1>0. Specifically, the polysilicon gate electrode 22 of the MOS capacitor 20 is connected to the 2-stage variable voltage source 30, and the substrate 24 is connected to the input node 50. In this case, the voltage of the MOS capacitor 20 is represented as Vc2 by an arrow in the direction opposite to the case of Vc1>0. Accordingly, Vc2=−(Vc1−v), and v, VH, VL, and Vc1 are all negative. According to the Vc2−C2 curve shown in FIG. 4B, the respective equations (2) and (3) are replaced by the following equations (4) and (5).

$$VL \leq Vc1 - Vca - Vs \qquad (4)$$

$$VL \geq Vc1 + Vcb + Vs \qquad (5)$$

In this case, also, the potential of the constant voltage Vc1 at the rearward end is not necessarily be 0, as a matter of course.

As described above, according to the principle of the present invention, in the circuit 60 or 60a in which the MOS capacitor 20 and the 2-stage variable voltage source 30 are connected in series, the respective voltages VH and VL of the voltage source 34 and the voltage source 36 of the 2-stage variable voltage source are set such that the voltage Vc2 of the MOS capacitor falls within the high capacitance operation region or the low capacitance operation region, irrespective of the input signal. Thereby, by switching the output voltage v of the 2-stage variable voltage source to either of voltages VH and VL, the capacitance C2 of the MOS capacitor can be set to either of the high capacitance Ca and the low capacitance Cb.

It should be noted that FIG. 2A shows only the integrated circuit 1 to be mounted in a single IC chip. Therefore, an optional number of different circuits may be mounted in front and/or rear sides of the circuit 1. Assuming now that the circuit 1 is a first stage circuit to be mounted on the IC chip, it is preferable that the coupling capacitor 10 is not surface mounted, but is externally mounted, from the viewpoint of a degree of freedom in design and reduction of a layout area.

Embodiments of the present invention will now be described herebelow. The above-mentioned principle is effective to all the embodiments.

First Embodiment

FIG. 5 is a circuit diagram showing an integrated circuit 1a, in which a variable gain amplifier 2 is integrated, according to the first embodiment of the present invention.

The integrated circuit 1a of FIG. 5 is different from the integrated circuit 1 shown in FIG. 2A in that the circuit 40 is replaced with a voltage amplifier 40a with an input clamp function, and the variable capacitance circuit 60 is replaced with a variable capacitance circuit 60b, a buffer inverter 321 is inserted in a line for a switch signal, and a buffer inverter 47 is added to supply a clamp pulse signal to the voltage amplifier 40a with the input clamp function. In this case, on the assumption that the variable gain amplifier 2 to be mounted at the first stage of the integrated circuit, the coupling capacitor 10 is not included in the variable gain amplifier 2.

The voltage amplifier 40a has a clamp circuit 41a in place of the reference voltage source 41, and is composed of an N-MOS transistor 42 having a gate and drain connected to a power source V, and a source-grounded N-MOS transistor 43 having a gate connected to the input node 50 and a drain connected to the source of the N-MOS transistor 42. A coupling node between the source of the transistor 42 and the drain of the transistor 43 is used as an output terminal To of the voltage amplifier 40a, i.e., the variable gain amplifier 2. The clamp circuit 41a is composed of a DC voltage source 45 and a clamp switch (N-MOS transistor) 46. The DC voltage source 45 has a grounded cathode electrode and supplies a clamp voltage Vc1. The clamp switch 46 (N-MOS transistor) is composed of a first contact (source or drain) connected to the input node 50, a second contact connected to the anode terminal of the DC voltage source 45, and a control terminal (gate) connected an output terminal of the inverter 47. An open end of the coupling capacitor 10 serves as a signal input terminal Ti of the coupling capacitor 10. In addition, an input terminal of the inverter 47 is connected to a clamp-switch control terminal Tc1.

The N-MOS transistor 43 inversely amplifies a voltage supplied from the input node 50. The N-MOS transistor 42 serves as a constant current source that supplies a current to the drain of the N-MOS transistor 43. The switch 46 as the clamp switch is controlled to turn ON only when setting the voltage of the input node 50 and to turn OFF in a duration during which the N-MOS transistor 43 operates as an inversion amplifier.

The variable capacitance circuit 60b is the same as the variable capacitance circuit 60 of FIG. 2A, except that the 2-stage variable voltage source 30 is replaced by a 2-stage variable voltage source 30a. The 2-stage variable voltage source 30a is the same as the 2-stage variable voltage source 30, except that the voltage VH of the voltage source 34 becomes 0 V, i.e., is replaced by a short line 34a, and the 2-contact switch 32 is replaced by two switches 322 and 324 (N-MOS transistors) and one inverter 323. Specifically, first contacts (sources or drains) of the switches 322 and 324 are connected to the input node 50. The second contact of the switch 322 is grounded via the short line 34a, and the second contact of the switch 324 is connected to the anode of the voltage source 36. The control terminal (gate) of the switch 322 is connected to an output of the buffer inverter 321 and an input of the inverter 323. The control terminal of the switch 324 is connected to an output of the inverter 323. An input of the buffer inverter 321 is connected to the gain switch terminal Tg.

Figure 6:
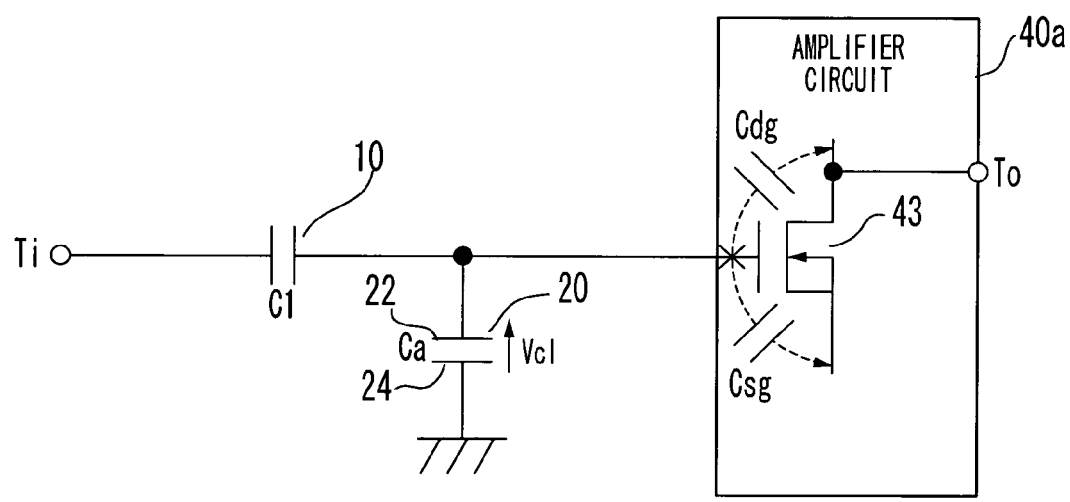
FIG. 6 is a diagram showing an equivalent circuit of a portion necessary to describe operation of the integrated circuit when the voltage at a gain switch terminal Tg is low.

An operation of the variable gain amplifier 2 will be described below in detail. FIG. 6 is an equivalent circuit diagram showing only a portion necessary to describe the operation of the circuit 1a when the voltage of the gain switch terminal Tg is low, specifically, when the switch 322 is turned ON and the switch 324 is turned OFF. In this case, the output of the 2-stage variable voltage source 30a becomes 0 V (grounded), and the voltage Vc2 of the MOS capacitor 20 becomes Vc1. In the integrated circuit 2, the clamp voltage Vc1 is determined in such a way that a variation range of the AC component of the input signal falls in a linear operation region of the amplifying transistor 43. Accordingly, the voltage Vc1 is set to a value larger than Vcb+Vs (see FIG. 2C).

Consequently, a voltage exceeding Vcb+Vs is applied to the MOS capacitor 20, so that the capacitance C2 of the MOS capacitor 20 becomes Ca.

Figure 7:
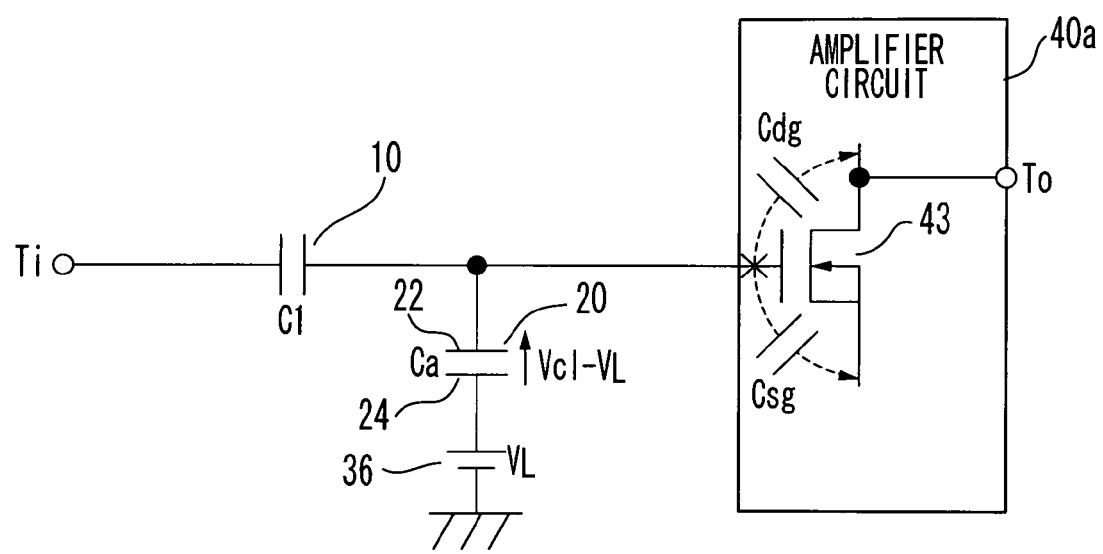
FIG. 7 is a diagram showing an equivalent circuit of the portion necessary to describe the operation of the integrated circuit when the voltage at the gain switch terminal Tg is high.

FIG. 7 is an equivalent circuit diagram showing only a portion necessary to describe the operation of the circuit 1a when the voltage of the gain switch terminal Tg is high, specifically, when the switch 322 is turned OFF and the switch 324 is turned ON. In this case, the output of the 2-stage variable voltage source 30a becomes VL, and the voltage Vc2 of the MOS capacitor 20 is Vc1−VL. Accordingly, when the voltage VL of the voltage source 36 is set to satisfy the equation (2), a voltage lower than −(Ca+Vs) is applied to the MOS capacitor 20. Consequently, the capacitance C2 of the MOS capacitor 20 becomes the low capacitance Cb.

According to the results described above, as can be seen through the comparison of a case where Ca is substituted for C2 of the above equation (1) and a case where Cb is substituted therefore, the amplification gain $\beta$ in the path from the signal input terminal Ti to the output terminal increases to Ca at which the MOS capacitor 20 is low, and decreases to Cb at which it is high.

As described above, in the variable gain amplifier 2 containing the variable capacitance circuit 60b according to the present invention, the amplification gain $\beta$ of the overall circuit can be switched by switching the capacitance of the single capacitor of the variable capacitance circuit 60b in response to the gain switch signal.

Figure 11:
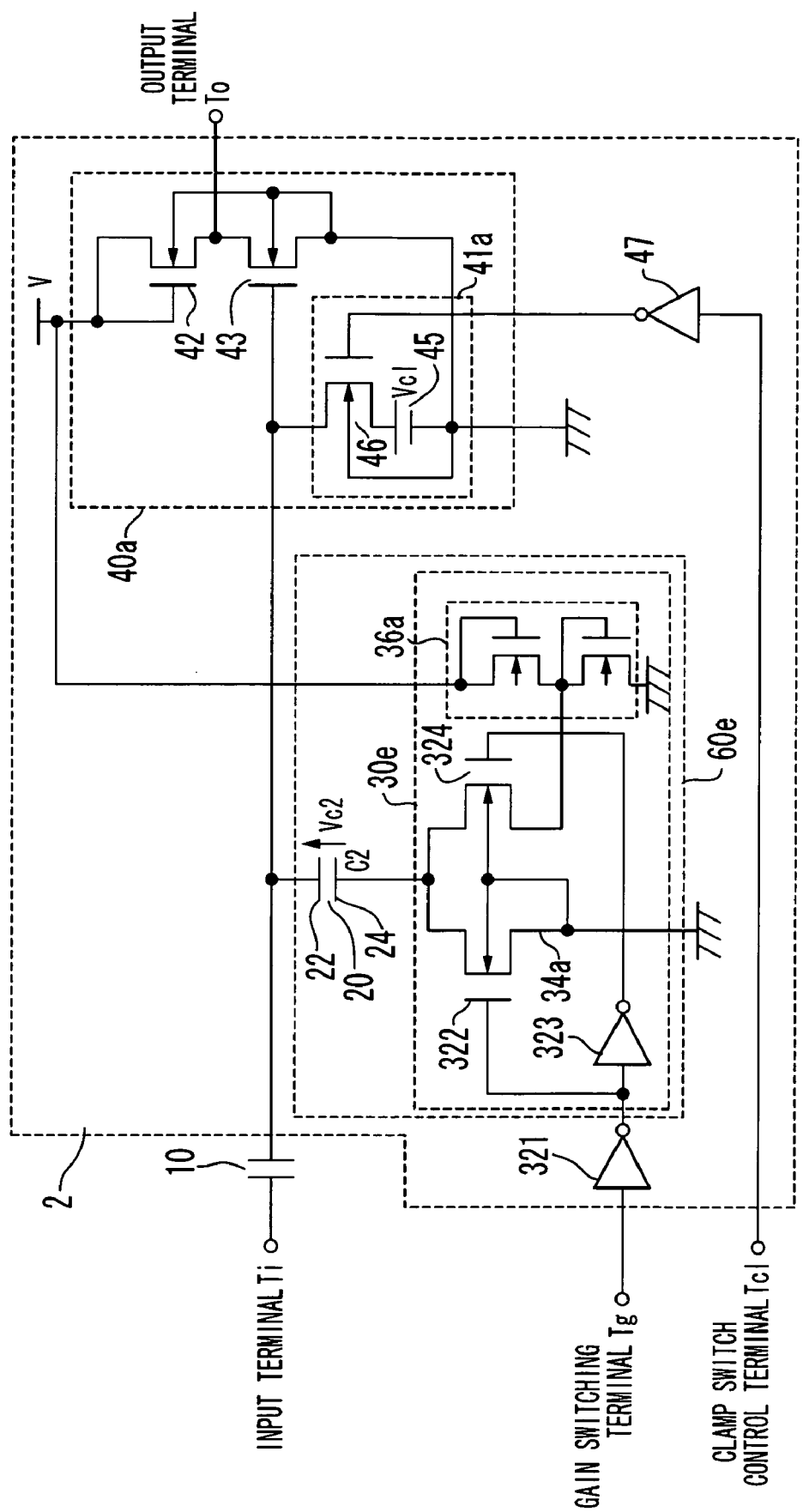
FIG. 11 is a circuit diagram showing a specific structure of a 2-stage variable voltage source of the variable capacity circuit shown in FIG. 4.

FIG. 11 is a circuit diagram showing a specific modification of the 2-stage variable voltage source 30a of the variable capacity circuit 60e shown in FIG. 5. The gain variable amplification circuit 2 shown in FIG. 11 is the same as the gain variable amplification circuit 2 shown in FIG. 5, excluding that the structure of the 2-stage variable voltage source 30a. It should be noted that the same components as those shown in FIG. 5 are identified by the same reference numerals, and the description is omitted.

As shown in FIG. 11, the 2-stage variable voltage source 30e includes switches 322 and 324, an inverter 323, a short circuited line 34a between the switch 322 and the ground potential, and a voltage source 36a. The voltage source 36a is composed of transistors 325 and 326 connected in series between the power supply voltage V and the ground potential. In this way, the voltage VL is generated by dividing the voltage between the power supply voltage V and the ground potential.

In the gain variable amplification circuit 2 configured in this way, a layout area can be reduced for one capacitor, compared with the conventional example shown in FIG. 1. The two transistors are used to realize the voltage source VL and the layout area of the two transistors is small compared with the layout area of the capacitor. Therefore, the layout area can be made small compared with the conventional example shown in FIG. 1.

Figure 12:
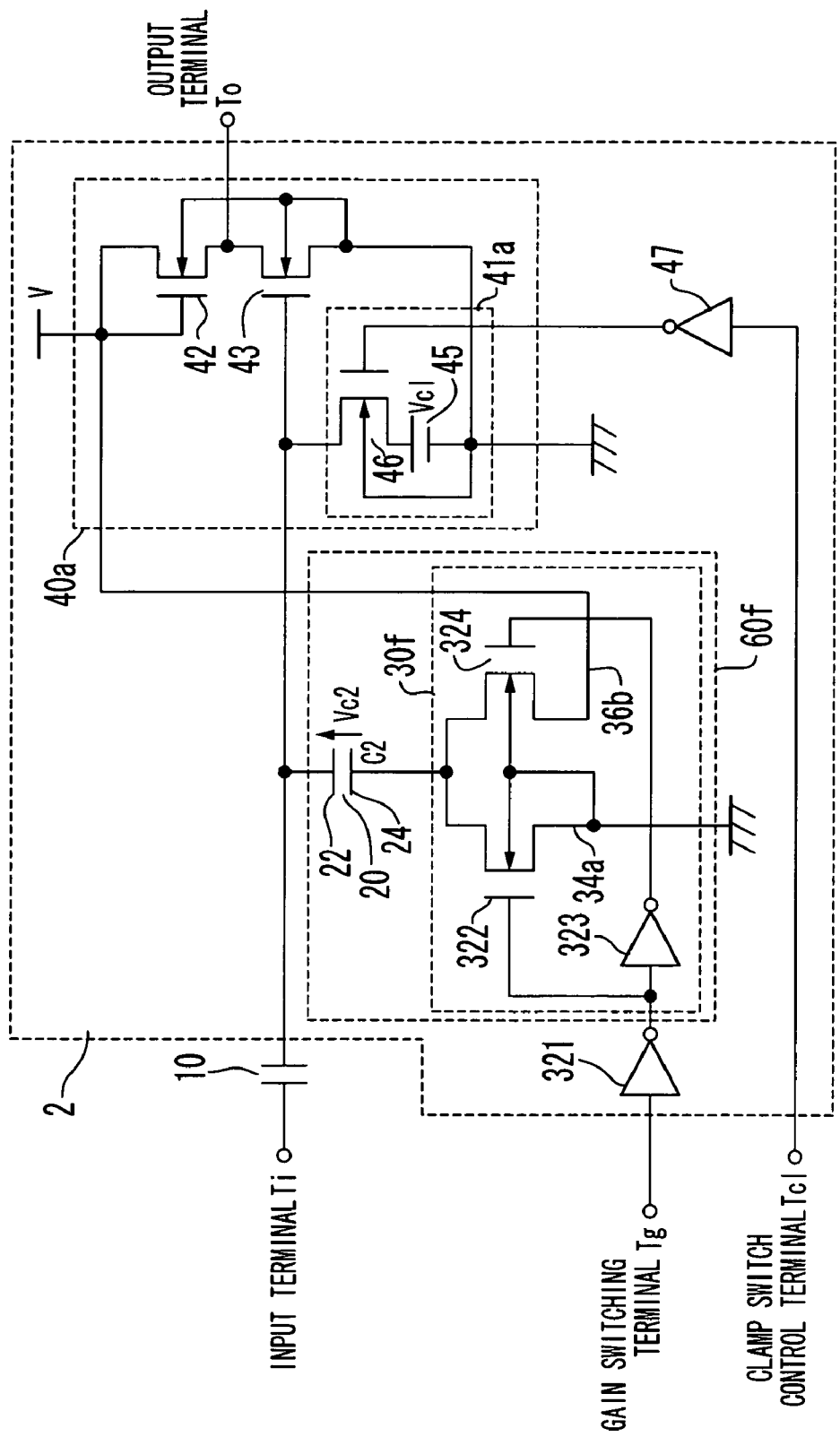
FIG. 12 is a circuit diagram showing a variable capacity circuit in which the further reduction of a layout area is attempted.

FIG. 12 is a circuit diagram showing a variable capacity circuit 2 in which the further reduction of the layout area is attempted. The gain variable amplification circuit 2 shown in FIG. 12 is the same as the gain variable amplification circuit 2 shown in FIG. 5, excluding the structure of the 2-stage variable voltage source 30, like a case of FIG. 11. Also, the 2-stage variable voltage source 30f of FIG. 12 is the same as the 2-stage variable voltage source 30a of FIG. 5, excluding the structure of voltage source 36. Therefore, the same components as those shown in FIG. 5 are shown by the same reference numerals, and the description is omitted.

In FIG. 12, the voltage of voltage source 36 is set to V [volts], i.e., the power supply voltage through a short-circuited line 36b. Therefore, the switch 324 is connected with the power supply voltage V by the short-circuited line 36b. In the variable capacity circuit 2 configured in this way, a layout area can be made smaller, compared with the variable capacity circuit shown in FIG. 11, because the transistors to realize the voltage source VL become unnecessary. That is, in the circuit shown in FIG. 12, the variable capacity circuit with two kinds of capacitances can be realized by a single capacitor, two switches, and a wiring line to connect the switch and the ground voltage or the power supply voltage. Therefore, the layout area can be made smaller compared with the conventional example shown in FIG. 1.

Second Embodiment

Figure 8:
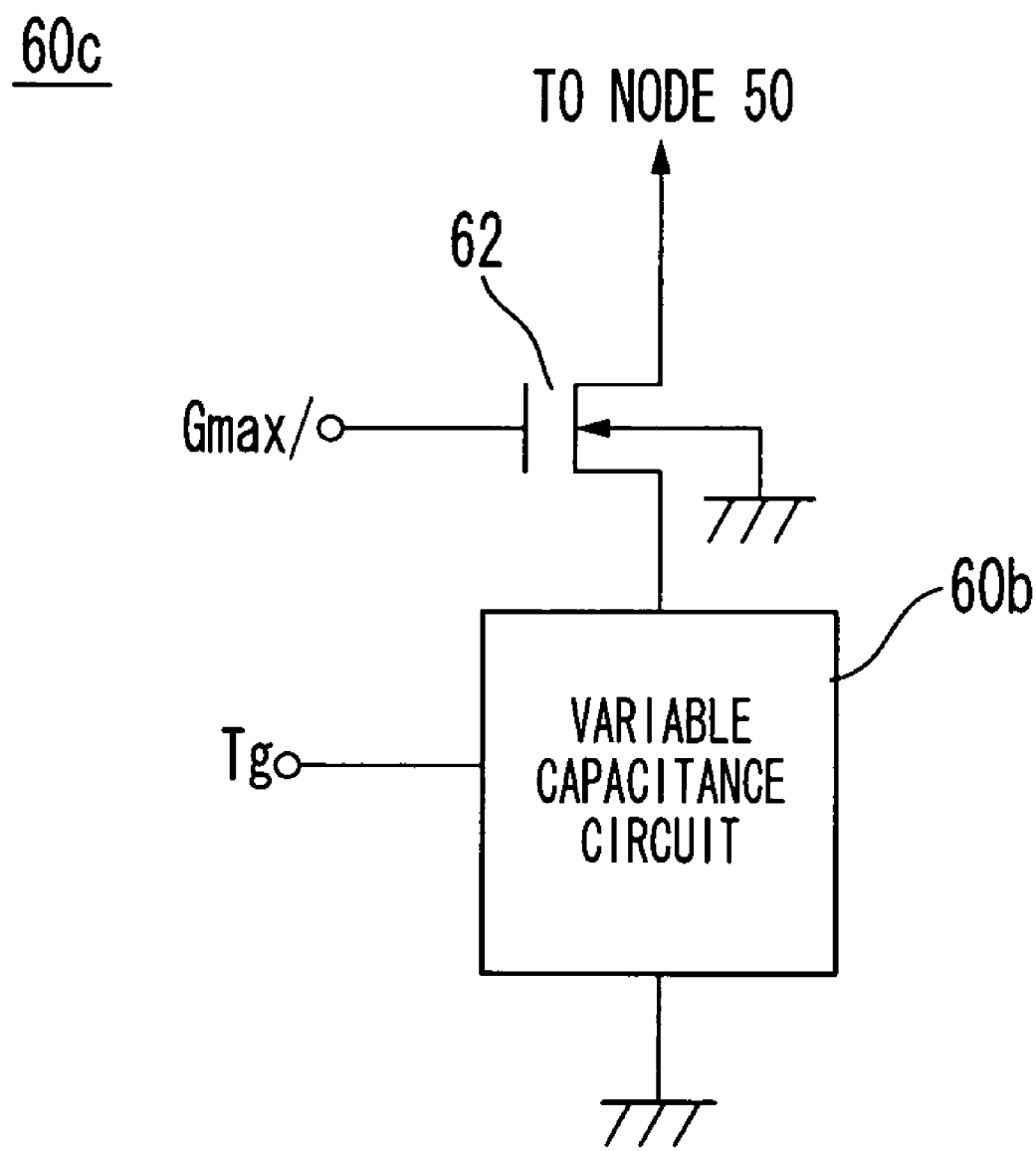
FIG. 8 is a circuit diagram showing a part of an integrated circuit according to a second embodiment of the present invention.

FIG. 8 shows a circuit 60b in which a switch 62 (N-MOS transistor) is added to the variable capacitance circuit 60b. In the variable capacitance circuit 60c, the switch 62 is inserted between the input node 50 and the variable capacitance circuit 60b. A control signal Gmax/ is supplied to the control terminal (gate) of the switch 62. When the control signal Gmax/ is low, the switch 62 is turned OFF, and the amplification gain β is maximized. When the control signal Gmax/ is high, the switch 62 is turned ON, and the amplification gain β can be switched between two stages by the gain switch terminal Tg, as described above. Thus, in the second embodiment, with the single MOS capacitor, the amplification gain β can be switched among three stages.

Third Embodiment

Figure 10:
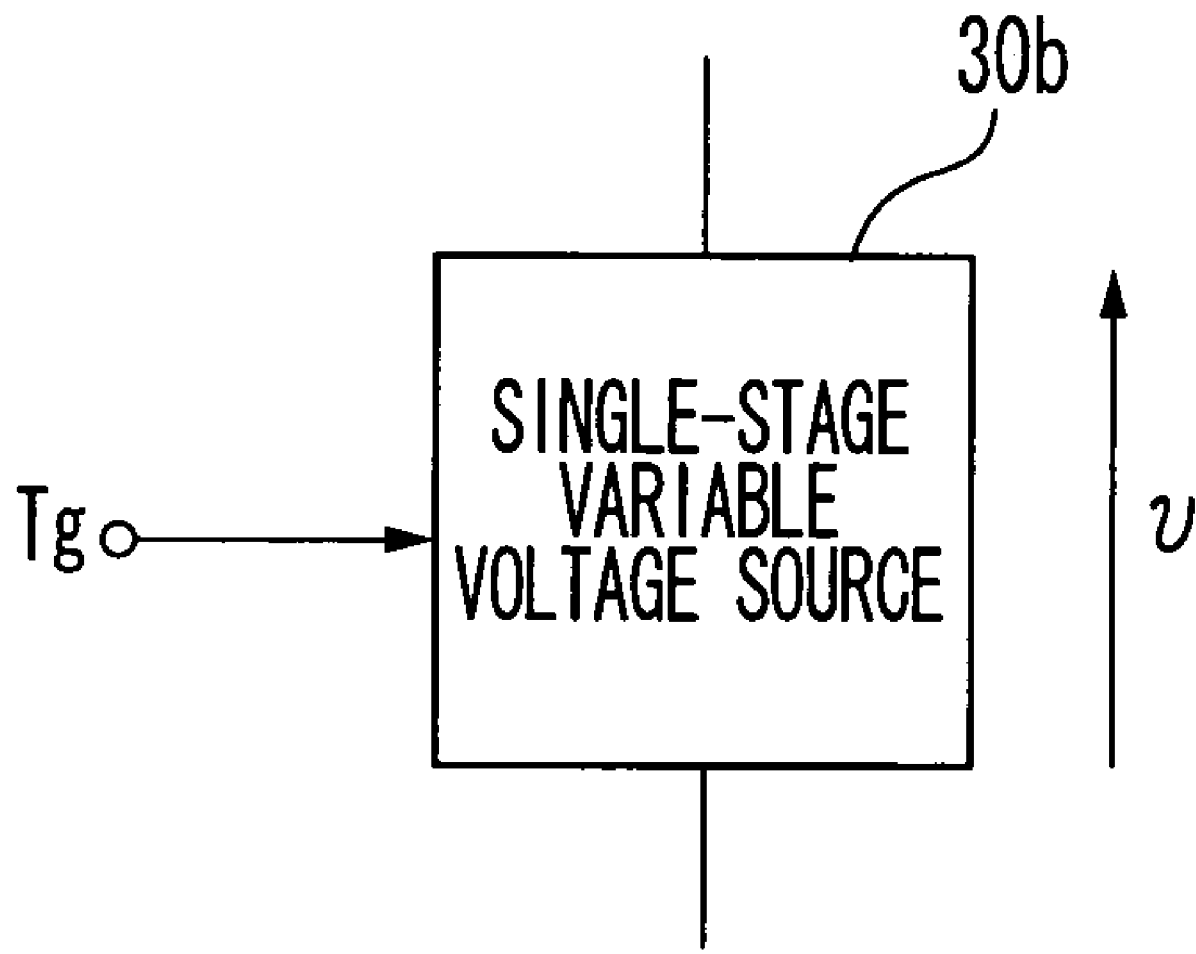
FIG. 10 is a circuit diagram of a part of the integrated circuit according to a third embodiment of the present invention.

As above, the examples that the 2-stage variable voltage source 30a is used to control the voltage Vc2 of the MOS capacitor 20 are described in the above embodiments. In the third embodiment, the 2-stage variable voltage source 30a is replaced by a variable voltage source 30b shown in FIG. 10 that can set the voltage to an optional value within a predetermined range. Specifically, in the third embodiment, the variable voltage source 30b is connected to one terminal 24 of the capacitance C2.

According to the third embodiment, the voltage to be applied from the variable voltage source 30b to the one terminal 24 of the capacitance C2 is set to an optional value close to 0 V (that is, the voltage is set to an optional value in a range of from −Vca to Vcb), and the capacitance value applied from the capacitance C2 to the voltage amplifier 40a can be finely adjusted to the optional value. That is, with the single capacitance C2, the gain of the voltage amplifier 40a can be finely adjusted.

Fourth Embodiment

Figure 9:
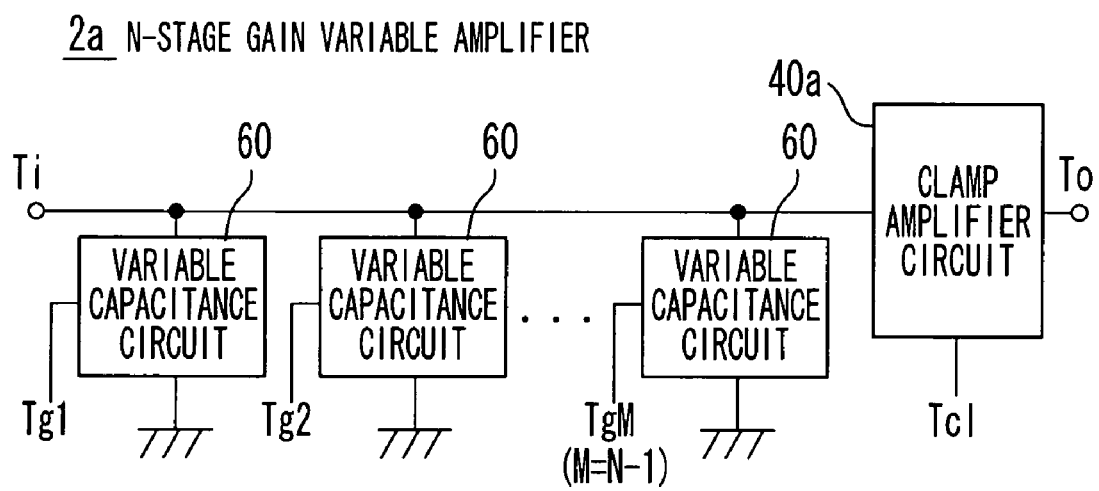
FIG. 9 is a circuit diagram of a part of an integrated circuit according to a fourth embodiment of the present invention.

FIG. 9 is a circuit diagram showing an integrated circuit according to the fourth embodiment of the present invention. Referring to FIG. 9, an gain N-stage variable amplifier 2a is composed of M(=N−1) variable capacitance circuits 60, which are inserted in parallel between an input node and the ground conductor, and the voltage amplifier 40a (see FIG. 5) with the input terminal connected to the input node. In the N-stage variable gain amplifier 2a, when all switching signals Tg1, Tg2, ..., and TgM are set to be high, the capacitance between the input node and the ground conductor becomes a minimum M*Ca. When one signal Tgj (1≦j≦M) is set to be low one by one, the capacitance between the input node and the ground conductor is incremented in units of (Cb−Ca) to finally be a maximum M*Cb. Therefore, the capacitance (that is, the amplification gain β) can be switched among (M+1) stages.

Of course, any of the variable capacitance circuits 60a to 60c, 60e and 60f may be used for the variable capacitance circuit 60. If the M variable capacitance circuit 60c is used, the capacitance, i.e., the gain can be switched among (2M+1) including the capacitance of 0.

In the present embodiment, since the number of control lines is increased, it is ineffective to connect the control lines to IC pins as they are. Preferably, a controller (not shown) is incorporated, an external mode signal and a serial data line are used to permit a switch level to be serially input as command, and the command is decoded by the controller, to generate the switching signals Tg1, Tg2, ..., and TgM and Tc1. Thus, since many amplification levels can be realized, the N-stage variable gain amplifier 2a of the present embodiment is suited to be built into a high-performance CCD digitizer.

The N-stage variable gain amplifier 2a shown in FIG. 9 is assumed to have the external coupling capacitor 10, and the coupling capacitor 10 is not contained therein.

It could be understood that the above embodiments are given only for the purpose of describing and illustrating the present invention. Accordingly, various modifications should easily be able to be made to the embodiments by those skilled in the art in the scope of the present invention.

For example, the semiconductor substrate of the MOS capacitor 20 is the N-type semiconductor substrate in the above description. However, the invention can be applied to a P-type semiconductor substrate.

In the respective variable capacitance circuit 60, 60a, and 60b shown in FIGS. 2A, 4A, and 5, the order of the MOS capacitor 20 and the 2-stage variable voltage source 30 (or 30a) may be reversed.

In the embodiments shown in FIGS. 5 and 8, all the transistors are the N-MOS transistors, but the invention may be applied to P-MOS transistors. For example, in the 2-stage variable voltage source 30a of FIG. 5, if the P-MOS transistor is used for any one of the N-MOS transistors 322 and 324, the inverter 323 can be omitted.

In the above, the term "input node" is used for the convenience of description. However, this term represents the entirety of conductors or conduction lines for communicating the input signal incoming through the coupling capacitor.

According to the present invention, since the single MOS capacitor can provide two types of capacitances to an electronic circuit, the layout area can be reduced.

What is claimed is:

1. A variable capacitance circuit comprising:
   a MOS capacitor; and
   an application voltage switching section which changes an application voltage to said MOS capacitor to change a capacitance of said MOS capacitor,
   wherein said variable capacitance circuit connects said MOS capacitor to an electronic circuit, and said application voltage is independent of an input signal supplied to said electronic circuit and said application voltage is independent of an output signal generated by said electronic circuit.

2. The variable capacitance circuit according to claim 1, wherein said electronic circuit is a voltage amplification circuit, and
   said variable capacitance circuit functions as a gain switching circuit configured to switch a gain of said voltage amplification circuit, by changing said capacitance to be connected to said voltage amplification circuit.

3. The variable capacitance circuit according to claim 1, wherein a switch is inserted between a connection conductor and said variable capacitance circuit and configured to open and close in response to a binary control signal.

4. A variable capacitance circuit comprising:

a MOS capacitor; and an application voltage switching section which changes an application voltage to said MOS capacitor to change a capacitance of said MOS capacitor, wherein said variable capacitance circuit connects said MOS capacitor to an electronic circuit, and wherein said electronic circuit receives an input signal through a coupling capacitor connected with a connection conductor, through which said electronic circuit is connected with one end of said variable capacitance circuit, said electronic circuit comprises:

a reference voltage source connected to said connection conductor in parallel to said variable capacitance circuit and configured to apply a predetermined DC voltage to said connection conductor; and said application voltage switching section comprises a variable voltage source connected with said MOS capacitor in series and configured to output an output voltage in response to a control signal.

5. The variable capacitance circuit according to claim 4, wherein said MOS capacitor presents a first capacitance when said application voltage is in a first region lower than a first negative threshold voltage and presents a second capacitance higher than said first capacitance when said application voltage is in a second region higher than a second positive threshold voltage, said control signal is a binary signal, said variable voltage source outputs one of a first voltage and a second voltage different from said first voltage in response to said control signal, said first voltage is set such that said application voltage falls within said first region regardless of a change of said input signal, and said second voltage is set such that said application voltage falls within said second region regardless of the change of said input signal.

6. The variable capacitance circuit according to claim 5, wherein said first voltage and said second voltage are sets such that the following relations are met:

(said first voltage)≧(a specified DC voltage−said first threshold voltage+a permission voltage range of said change of said input signal), and (said second voltage)≦(said specified DC voltage+ second threshold voltage−said permission voltage of said change of said input signal).

7. The variable capacitance circuit according to claim 5, wherein said variable voltage source comprises:

a first voltage source which outputs said first voltage;

a second voltage source which outputs said second voltage; and a 2-contact switch circuit which connects one of said first voltage source and said second voltage source with said MOS capacitor in response to said control signal.

8. An integrated circuit comprising:

an electronic circuit which processes a signal supplied from a signal input terminal; and a variable capacitance circuit which switches a capacitance connected to said electronic circuit, wherein said variable capacitance circuit comprises:

a MOS capacitor connected with said electronic circuit; and an application voltage switching section which switches an application voltage to said MOS capacitor to change a capacitance of said MOS capacitor, and said application voltage is independent of said signal supplied to said electronic circuit and said application voltage is independent of an output signal generated by said electronic circuit.

9. The integrated circuit according to claim 8, wherein said electronic circuit is a voltage amplification circuit, and said variable capacitance circuit comprises a gain switching circuit configured to switch a gain of said voltage amplification circuit, by changing said capacitance connected to said voltage amplification circuit.

10. The integrated circuit according to claim 8, wherein said variable capacitance circuit further comprises:

a switch inserted between a series circuit of said MOS capacitor and said variable voltage source and a connection conductor and configured to open or close in response to a binary control signal.

11. An integrated circuit comprising:

an electronic circuit which processes a signal supplied from a signal input terminal; and a variable capacitance circuit which switches a capacitance connected to said electronic circuit, wherein said variable capacitance circuit comprises:

a MOS capacitor connected with said electronic circuit; and an application voltage switching section which switches an application voltage to said MOS capacitor to change a capacitance of said MOS capacitor, wherein said electronic circuit receives an input signal through a coupling capacitor connected with a connection conductor, through which said electronic circuit is connected with one end of said variable capacitance circuit, said electronic circuit comprises:

a reference voltage source connected to said connection conductor in parallel to said variable capacitance circuit, wherein said reference voltage source applies a specified DC voltage to said connection conductor, and said application voltage switching section comprises a variable voltage source connected with said MOS capacitor in series, wherein said variable voltage source outputs an output voltage in response to a control signal.

12. The integrated circuit according to claim 11, wherein said variable voltage source outputs an optional voltage in a specified range in response to said control signal.

13. The integrated circuit according to claim 11, wherein said MOS capacitor presents a first capacitance when said application voltage is in a first region lower than a first negative threshold voltage and presents a second capacitance higher than said first capacitance when said application voltage is in a second region higher than a second positive threshold voltage, said control signal is a binary signal, said variable voltage source outputs one of a first voltage and a second voltage different from said first voltage in response to said control signal, said first voltage is set such that said application voltage falls within said first region regardless of a change of said input signal, and said second voltage is set such that said application voltage falls within said second region regardless of the change of said input signal.

14. The variable capacitance circuit according to claim 13, wherein said first voltage and said second voltage are sets such that the following relations are met:

(said first voltage)≧(a specified DC voltage−said first threshold voltage+a permission voltage range of said change of said input signal), and (said second voltage)≦(said specified DC voltage+
said second threshold voltage−said permission
voltage of said change of said input signal).

15. The integrated circuit according to claim 13, wherein said variable voltage source comprises:
 a first voltage source which outputs said first voltage;
 a second voltage source which outputs said second voltage; and
 a 2-contact switch circuit which connects one of said first voltage source and said second voltage source with said MOS capacitor in response to said control signal.

16. The integrated circuit according to claim 15, wherein the output voltage of said first voltage source is zero.

17. The integrated circuit according to claims 15, wherein said 2-contact switch circuit comprises:
 two MOS transistors in which one of drain electrodes and source electrodes is connected to a common terminal, and the other of drain and source electrodes constitutes two contacts; and
 an inverter circuit connected between gate electrodes of said two MOS transistors.

18. The integrated circuit according to claim 11, wherein said reference voltage source is a clamping circuit, and said integrated circuit comprises a clamp switch circuit inserted between said connection conductor and said clamping circuit.

19. An integrated circuit comprising:
 an electronic circuit which processes a signal supplied from a signal input terminal; and
 a variable capacitance circuit which switches a capacitance connected to said electronic circuit,
 wherein said variable capacitance circuit comprises:
 a MOS capacitor connected with said electronic circuit; and
 an application voltage switching section which switches an application voltage to said MOS capacitor to change a capacitance of said MOS capacitor, and
 wherein said variable capacitance circuit comprises a plurality of said variable capacitance circuits connected in parallel.

20. The integrated circuit according to claim 19, further comprising:
 a control unit which receives an external command, decodes said command, and generates said control signal based on said command to control application voltage sources of said plurality of variable capacitance circuits.

21. A variable capacitance circuit comprising:
 a MOS capacitor; and
 an application voltage switching section which changes an application voltage to said MOS capacitor to change a capacitance of said MOS capacitor,
 wherein said variable capacitance circuit connects said MOS capacitor to an electronic circuit,
 wherein said electronic circuit receives an input signal through a coupling capacitor connected with a connection conductor, through which said electronic circuit is connected with one end of said variable capacitance circuit, and
 wherein said application voltage switching section comprises a variable voltage source connected in series with said MOS capacitor, and
 said variable voltage source comprises a 2-contact switch circuit configured to supply one of a ground potential and a power supply voltage in response to a control signal.

22. A variable capacitance circuit comprising:
 a MOS capacitor; and
 an application voltage switching section which changes an application voltage to said MOS capacitor to change a capacitance of said MOS capacitor,
 wherein said variable capacitance circuit connects said MOS capacitor to an electronic circuit,
 wherein said electronic circuit receives an input signal through a coupling capacitor connected with a connection conductor, through which said electronic circuit is connected with one end of said variable capacitance circuit, and
 wherein said electronic circuit comprises a reference voltage source connected in parallel to said variable capacitance circuit to apply a predetermined DC voltage to said variable capacitance circuit.

23. A variable capacitance circuit comprising:
 a MOS capacitor; and
 an application voltage switching section which changes an application voltage to said MOS capacitor to change a capacitance of said MOS capacitor,
 wherein said variable capacitance circuit connects said MOS capacitor to an electronic circuit,
 wherein said electronic circuit receives an input signal through a coupling capacitor connected with a connection conductor, through which said electronic circuit is connected with one end of said variable capacitance circuit, and
 wherein said application voltage switching section comprises a variable voltage source connected in series to said MOS capacitor, wherein said variable voltage source outputs a voltage in response to a control signal.

24. An integrated circuit comprising:
 an electronic circuit which processes a signal supplied from a signal input terminal; and
 a variable capacitance circuit which switches a capacitance connected to said electronic circuit,
 wherein said variable capacitance circuit comprises:
 a MOS capacitor connected with said electronic circuit; and
 an application voltage switching section which switches an application voltage to said MOS capacitor to change a capacitance of said MOS capacitor, and
 wherein said electronic circuit comprises a reference voltage source connected in parallel to said variable capacitance circuit to apply a predetermined DC voltage to said variable capacitance circuit.

25. An integrated circuit comprising:
 an electronic circuit which processes a signal supplied from a signal input terminal; and
 a variable capacitance circuit which switches a capacitance connected to said electronic circuit,
 wherein said variable capacitance circuit comprises:
 a MOS capacitor connected with said electronic circuit; and
 an application voltage switching section which switches an application voltage to said MOS capacitor to change a capacitance of said MOS capacitor, and
 wherein said application voltage switching section comprises a variable voltage source connected in series to said MOS capacitor, wherein said variable voltage source outputs a voltage in response to a control signal.

* * * * *